(12) United States Patent
Yeo et al.

(10) Patent No.: US 7,368,334 B2
(45) Date of Patent: May 6, 2008

(54) SILICON-ON-INSULATOR CHIP WITH MULTIPLE CRYSTAL ORIENTATIONS

(75) Inventors: Yee-Chia Yeo, Hsin-Chu (TW); Fu-Liang Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 19 days.

(21) Appl. No.: 11/073,911

(22) Filed: Mar. 7, 2005

(65) Prior Publication Data

US 2006/0084244 A1 Apr. 20, 2006

Related U.S. Application Data

(62) Division of application No. 10/408,081, filed on Apr. 4, 2003, now Pat. No. 6,902,962.

(51) Int. Cl.
*H01L 21/00* (2006.01)
*H01L 21/339* (2006.01)

(52) U.S. Cl. .............. 438/150; 438/151; 438/152; 438/155; 438/198; 257/E21.457

(58) Field of Classification Search ............... 438/199, 438/243, 719, 164, 486, 222, 226, 245, 269, 438/416, 417, 429, 442, 150, 151, 152, 155; 257/66, 67, 69, 70, E21.457
See application file for complete search history.

(56) References Cited

U.S. PATENT DOCUMENTS 3,964,942 A * 6/1976 Berkenblit et al. ......... 216/101

| | | |
|---|---|---|
| 4,072,974 A | 2/1978 | Ipri |
| 4,753,896 A | 6/1988 | Matloubian |

(Continued)

FOREIGN PATENT DOCUMENTS

JP 2003-229577 8/2003

(Continued)

OTHER PUBLICATIONS

Current, M.I., et al., "Atomic-layer Cleaving with $Si_xGe_y$ Strain Layers for Fabrication of Si and Ge-rich SOI Device Layers," 2001 IEEE SOI Conference, Oct. 1-4, 2001, Durango, CO, Rev. 2, May 10, 2001, pp. 1-3.

(Continued)

*Primary Examiner*—Michael Lebentritt
*Assistant Examiner*—Angel Roman
(74) *Attorney, Agent, or Firm*—Slater & Matsil, L.L.P.

(57) ABSTRACT

A silicon-on-insulator chip includes an insulator layer, typically formed over a substrate. A first silicon island with a surface of a first crystal orientation overlies the insulator layer and a second silicon island with a surface of a second crystal orientation also overlies the insulator layer. In one embodiment, the silicon-on-insulator chip also includes a first transistor of a first conduction type formed on the first silicon island, and a second transistor of a second conduction type formed on the second silicon island. For example, the first crystal orientation can be (110) while the first transistor is a p-channel transistor, and the second crystal orientation can be (100) while the second transistor is an n-channel transistor.

20 Claims, 8 Drawing Sheets

U.S. PATENT DOCUMENTS

| | | | |
|---|---|---|---|
| 4,768,076 A | | 8/1988 | Aoki et al. |
| 4,857,986 A | | 8/1989 | Kinugawa |
| 4,908,328 A | * | 3/1990 | Hu et al. .................... 438/269 |
| 4,933,298 A | | 6/1990 | Hasegawa |
| 5,013,681 A | | 5/1991 | Godbey et al. |
| 5,024,723 A | | 6/1991 | Goesele et al. |
| 5,213,986 A | | 5/1993 | Pinker et al. |
| 5,374,564 A | | 12/1994 | Bruel |
| 5,384,473 A | * | 1/1995 | Yoshikawa et al. ......... 257/255 |
| 5,468,657 A | | 11/1995 | Hsu |
| 5,633,588 A | | 5/1997 | Hommei et al. |
| 5,659,192 A | | 8/1997 | Sarma et al. |
| 5,663,588 A | | 9/1997 | Suzuki et al. |
| 5,739,574 A | | 4/1998 | Nakamura |
| 5,759,898 A | | 6/1998 | Ek et al. |
| 5,769,991 A | | 6/1998 | Miyazawa et al. |
| 5,792,669 A | | 8/1998 | Baumann et al. |
| 5,849,627 A | | 12/1998 | Linn et al. |
| 5,863,830 A | | 1/1999 | Bruel et al. |
| 5,882,981 A | | 3/1999 | Rajgopal et al. |
| 5,882,987 A | | 3/1999 | Srikrishnan |
| 5,904,539 A | | 5/1999 | Hause et al. |
| 6,022,799 A | | 2/2000 | Foote et al. |
| 6,023,082 A | | 2/2000 | McKee et al. |
| 6,143,070 A | | 11/2000 | Bliss et al. |
| 6,159,824 A | | 12/2000 | Henley et al. |
| 6,204,098 B1 | * | 3/2001 | Anceau ....................... 438/149 |
| 6,207,005 B1 | | 3/2001 | Henley et al. |
| 6,252,284 B1 | | 6/2001 | Muller et al. |
| 6,291,321 B1 | | 9/2001 | Fitzgerald |
| 6,326,285 B1 | | 12/2001 | Behfar et al. |
| 6,335,231 B1 | | 1/2002 | Yamazaki et al. |
| 6,355,541 B1 | | 3/2002 | Holland et al. |
| 6,358,806 B1 | | 3/2002 | Puchner |
| 6,368,938 B1 | | 4/2002 | Usenko |
| 6,407,406 B1 | | 6/2002 | Tezuka |
| 6,410,371 B1 | | 6/2002 | Yu et al. |
| 6,410,938 B1 | | 6/2002 | Xiang |
| 6,414,355 B1 | | 7/2002 | An et al. |
| 6,429,061 B1 | | 8/2002 | Rim |
| 6,448,114 B1 | | 9/2002 | An et al. |
| 6,455,398 B1 | | 9/2002 | Fonstad, Jr. et al. |
| 6,465,316 B2 | | 10/2002 | Hattori et al. |
| 6,483,171 B1 | | 11/2002 | Forbes et al. |
| 6,486,008 B1 | | 11/2002 | Lee |
| 6,497,763 B2 | | 12/2002 | Kub et al. |
| 6,531,754 B1 | * | 3/2003 | Nagano et al. ............. 257/510 |
| 6,534,380 B1 | | 3/2003 | Yamauchi et al. |
| 6,534,382 B1 | | 3/2003 | Sakaguchi et al. |
| 6,555,891 B1 | * | 4/2003 | Furukawa et al. .......... 257/505 |
| 6,562,703 B1 | | 5/2003 | Maa et al. |
| 6,583,440 B2 | | 6/2003 | Yasukawa |
| 6,593,634 B2 | * | 7/2003 | Ohmi et al. ................. 257/412 |
| 6,600,170 B1 | * | 7/2003 | Xiang ......................... 257/18 |
| 6,603,156 B2 | | 8/2003 | Rim |
| 6,608,354 B2 | * | 8/2003 | Hokazono et al. .......... 257/382 |
| 6,624,488 B1 | * | 9/2003 | Kim ............................ 257/411 |
| 6,633,061 B2 | | 10/2003 | Lutzen et al. |
| 6,649,492 B2 | | 11/2003 | Chu et al. |
| 6,661,065 B2 | | 12/2003 | Kunikiyo |
| 6,670,677 B2 | | 12/2003 | Choe et al. |
| 6,690,043 B1 | | 2/2004 | Usuda et al. |
| 6,815,278 B1 | * | 11/2004 | Ieong et al. ................. 438/198 |
| 6,835,981 B2 | * | 12/2004 | Yamada et al. ............. 257/347 |
| 6,861,326 B2 | * | 3/2005 | Gonzalez et al. ........... 438/361 |
| 6,949,420 B1 | * | 9/2005 | Yamashita .................. 438/149 |
| 7,141,506 B2 | * | 11/2006 | Endoh et al. ................ 438/710 |
| 2001/0001490 A1 | | 5/2001 | Sung et al. |
| 2002/0125475 A1 | | 9/2002 | Chu et al. |
| 2002/0140031 A1 | | 10/2002 | Rim |
| 2002/0185684 A1 | | 12/2002 | Campbell et al. |
| 2003/0013305 A1 | | 1/2003 | Sugii et al. |
| 2003/0080384 A1 | | 5/2003 | Takahashi et al. |
| 2003/0102518 A1 | | 6/2003 | Fried et al. |
| 2003/0104287 A1 | | 6/2003 | Yuasa |
| 2003/0227057 A1 | | 12/2003 | Lochtefeld et al. |

FOREIGN PATENT DOCUMENTS

JP          2003-289144         10/2003

OTHER PUBLICATIONS

Current, M.I., et al., "Atomic-layer Cleavint and Non-contact Thinning and Thickening for Fabrication of Laminated Electronic and Photonic Materials," 2001 Materials Research Society Spring Meeting, Apr. 16-20, 2001, San Franscisco, CA, Rev 6, Jun. 15, 2001, pp. 1-10.

Current, M.I., "Nanocleaving: An Enabling Technology for Ultrathin SOI," Extended Abstracts of International Workshop on Junction Technology 2002, Japan Society of Applied Physics, pp. 97-102.

Langdo, T.A., et al., "Preparation of Novel SiGe-Free Strained Si on Insulator Substrates," 2002 IEEE International SOI Conference Oct. 2002, pp. 211-212.

Mizuno, T., et al., "Novel SOI p-Channel MOSFETs With Higher Strain in Si Channel Using Double SiGe Heterostructures," IEEE Transactions on Electron Devices, vol. 49, No. 1, Jan. 2002, pp. 7-14.

Momose, H.S., et al., "Ultrathin Gate Oxide CMOS on (111) Surface-Oriented Si Substrate," IEEE Transactions on Electron Devices, vol. 49, No. 9, Sep. 2002, pp. 1597-1605.

Rim, K, et al., "Fabrication and Analysis of Deep Submicron Strained-Si N-MOSFET's," IEEE Transactions on Electron Devices, vol. 47, No. 7, Jul. 2000, pp. 1406-1415.

Stahlbush, R.E., et al., "Annealing of Total Dose Damage: Redistribution of Interface State Density on <100>, <110>, and <111> Orientation Silicon," IEEE Transactions on Nuclear Science, vol. 35, No. 6, Dec. 1998, pp. 1192-1196.

Wolf, S., et al., "Silicon Processing For The VLSI Era: vol. 1: Process Technology," Lattice Press, Sunset Beach, CA, pp. cover, 191, 193, and 194.

Satô, T., et al., "Mobility Anisotropy of Electrons in Inversion Layers on Oxidized Silicon Surfaces," Physical Review B, vol. 4, No. 6, Sep. 15, 1971, pp. 1950-1960.

* cited by examiner

SILICON-ON-INSULATOR CHIP WITH MULTIPLE CRYSTAL ORIENTATIONS

This application is a divisional of U.S. patent application Ser. No. 10/408,081, now U.S. Pat. No. 6,902,962, entitled "Silicon-on-Insulator Chip with Multiple Crystal Orientations," filed on Apr. 4, 2003, which application is incorporated herein by reference.

CROSS-REFERENCE TO RELATED APPLICATIONS

The following U.S. patents and/or commonly assigned patent applications are hereby incorporated herein by reference:

| U.S. Pat. No. or Ser. No. | Filing Date | Issue Date | Attorney Docket No. |
|---|---|---|---|
| 6,911,379 | Mar. 5, 2003 | Jun. 28, 2005 | TSMC2002-1384 |
| 6,949,451 | Mar. 10, 2003 | Sep. 27, 2005 | TSMC2002-1385 |

TECHNICAL FIELD

The present invention relates generally to semiconductor devices, and, in particular embodiments, to a silicon-on-insulator chip including silicon islands with multiple crystal plane orientations to enhance the performances of n-channel and p-channel transistors and several methods for the formation of such a silicon-on-insulator chip.

BACKGROUND

Complementary metal-oxide-semiconductor (CMOS) technology is the dominant semiconductor technology used for the manufacture of ultra-large scale integrated (ULSI) circuits today. Conventional CMOS technology employs (100) silicon wafer as the starting material for volume production. Such silicon wafers have a surface that is (100) oriented, i.e., the normal to the silicon wafer surface is in the [100] direction. Hence, conventional planar metal-oxide-semiconductor field-effect transistors (MOSFETs) formed on (100) silicon wafers have a gate dielectric-channel interface plane that is in the (100) plane of the silicon substrate.

Commercial CMOS technology universally uses (100) oriented silicon wafers because of their low surface state density on the order of $10^{10}$ per square centimeter on thermally oxidized surfaces. This compares with surface state densities in the order of $10^{11}$ per square centimeter on thermally oxidized surfaces with other crystal orientations such as the (110) and (111) planes. Another advantage is the high surface mobility of electrons on the (100) plane, as disclosed in "Mobility anisotropy of electrons in inversion layers in oxidized silicon surfaces," Physical Review B, vol. 4, no. 6, (15 Sep. 1971), pp. 1953.

As a result, an n-channel transistor formed on a silicon substrate with (100) surface provides the largest source-to-drain current. Another benefit of using (100) wafers is the ease of cleavage or cutting along (110) planes. This property is useful when dicing up processed wafers into separate dies prior to packaging, since the equivalent (110) planes intersect with the (100) silicon surface to form squarish shapes. However, the measured mobility of holes in a p-channel transistor is nearly the smallest when the gate dielectric-channel interface is in the (100) plane as compared to other crystal planes.

Size reduction of the transistor has provided significant improvement in the speed performance, circuit density, and cost per unit function of semiconductor chips over the past few decades. Significant challenges are faced when transistors are scaled into the sub-100 nm regime. This has resulted in research efforts on further improvement of n-channel and p-channel transistor performance using alternative techniques besides transistor scaling, such as the use of strain-induced band-structure modification and mobility enhancement to increase the transistor drive current. Another potential way to improve transistor performance is to explore the use of silicon substrates with non-conventional crystal orientations as the starting wafer.

U.S. Pat. No. 4,857,986, entitled "Short channel CMOS on (110) crystal plane" issued to M. Kinugawa, discloses the formation of CMOS transistors on a monocrystalline silicon substrate having a (110) crystal orientation. In U.S. Pat. No. 6,335,231, entitled "Method of fabricating a high reliable SOI substrate" issued to S. Yamazaki et al., a silicon-on-insulator substrate is fabricated having a main crystal surface that is (110) oriented. Both of these references use a (110) oriented silicon surface for both, the n-channel and p-channel planar transistors fabricated on these substrates have a gate dielectric-channel interface that is in the (110) plane.

In U.S. Pat. No. 4,768,076 ('076), entitled "Recrystallized CMOS with different crystal planes" issued to M. Aoki et al., a CMOS integrated chip is formed on a semiconductor crystalline surface having a plane azimuth (110) or (023) in order to increase the speed of operation. The semiconductor devices described in the '076 patent are stacked.

In U.S. Pat. No. 6,483,171 entitled "Vertical sub-micron CMOS transistors on (110), (111), (311), (511), and higher order surfaces of bulk, SOI and thin film structures and method of forming the same" issued to L. Forbes et al., a method for forming n-channel and p-channel transistors that includes cutting a substrate along a higher order orientation and fabricating vertical deep sub-micron n-channel and p-channel transistors on the substrates is provided. In this patent, the vertical transistors have a source-to-drain direction that is perpendicular to the surface of the wafer.

In U.S. Pat. No. 5,384,473, entitled "Semiconductor body having element formation surfaces with different orientations," issued to S. Yoshikawa et al., a semiconductor body is constructed such that a portion of a semiconductor substrate has a first surface plane and another portion of a second semiconductor substrate has a second surface plane.

In U.S. Pat. No. 4,933,298, entitled "Method of making high speed semiconductor device having a silicon-on-insulator structure" issued to M. Hasegawa, a CMOS silicon-on-insulator structure is fabricated by using a silicon substrate with (110) orientation and a silicon layer with (100) orientation. Openings are formed in the insulator to expose the (110) oriented substrate. Silicon regions are then formed with (110) orientation using the (110) substrate as a template. This method uses solid phase epitaxial growth rate.

SUMMARY OF THE INVENTION

The preferred embodiment of the present invention relates to a semiconductor device that includes active areas with different crystal orientations. This configuration is useful because the crystal plane orientation can be selected to enhance the performance of n-channel and p-channel transistors. For example, n-channel transistors can be formed in silicon regions with a (100) orientation and p-channel transistors can be formed in regions with a (110) orientation. In the preferred embodiment, the semiconductor device is a silicon-on-insulator device.

For example, in a first embodiment a silicon-on-insulator device includes an insulator layer, typically formed over a substrate. A first silicon island with a surface of a first crystal orientation overlies the insulator layer and a second silicon island with a surface of a second crystal orientation also overlies the insulator layer. The islands can be isolated from one another by an isolation technique such as shallow trench isolation or mesa isolation.

The present invention also provides several methods for the formation of such a silicon-on-insulator chip. Each of these methods is compatible with current CMOS processing and, therefore, are good candidates for commercialization.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The preferred embodiment of the present invention relates to a silicon-on-insulator chip that includes silicon islands with multiple surface crystal plane orientations to enhance the performances of n-channel and p-channel transistors. The present invention also provides several methods for the formation of such a silicon-on-insulator chip. In one aspect, the present invention provides optimized crystal orientations separately for the n-channel transistors and the p-channel transistors.

Transistors formed on silicon-on-insulator may be further improved by optimizing the surface crystal orientations of the islands on which the transistors are formed. This disclosure will first describe a silicon-on-insulator substrate that may be formed such that silicon islands with two or more surface crystal orientations are obtained.

Figure 1:
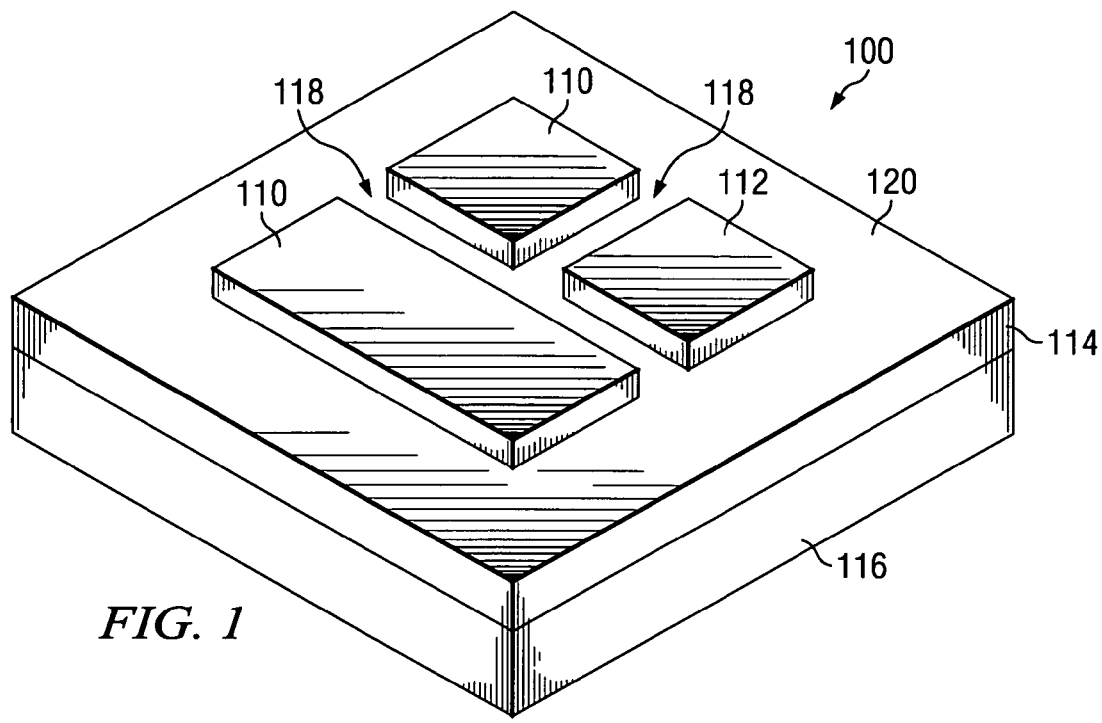
FIG. 1 is a three-dimensional perspective of a silicon-on-insulator chip with silicon islands of different surface crystal orientations.

FIG. 1 illustrates a three-dimensional perspective of a silicon-on-insulator substrate 100. The substrate 100 has been processed up to the step of silicon island formation. In this example, three islands (labeled with reference numerals 110 and 112) are formed on buried insulator 114. The islands are isolated from one another by trenches 118. In another embodiment, shallow trench isolation (STI) or other isolation can be used.

In FIG. 1, first silicon islands 110 have an (h k l) surface crystal orientation and second islands 112 have an (h' k' l') surface crystal orientation. In general, (h k l) and (h' k' l') are not equivalent crystal orientations. The crystal orientations may be such orientations as (110), (100), (023), (311), (511), (111), or any other crystal orientation given by (h k l) where h, k, and l are integers. In the preferred embodiment, islands 110 and 112 with surface crystal planes of the (100) and (110) crystal orientations are formed on the insulator layer 114. More preferably, silicon islands 110 (or 112) with (100) oriented surfaces are used for forming n-channel transistors (not shown) and silicon islands 112 (or 110) with (110) oriented surfaces are used for forming p-channel transistors (not shown).

Figure 2A:
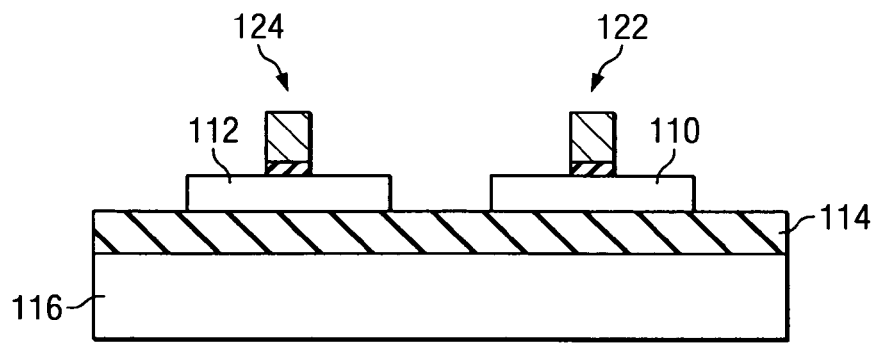
FIG. 2a is a specific example showing the use of (110) oriented islands for p-channel transistors and (100) oriented islands for n-channel transistors.
Figure 2B:
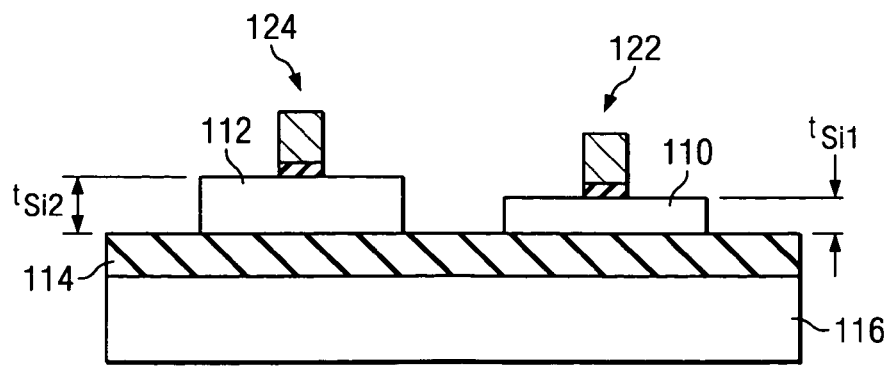
FIG. 2b is another specific example showing the use of (023) oriented islands for p-channel transistors and (100) oriented islands for n-channel transistors.

Cross-sections of two specific embodiments are schematically shown in FIGS. 2a and 2b. By forming n-channel transistors 122 on the (100) oriented silicon surfaces 110, maximum electron mobility and drive current can be obtained as compared to other crystal orientations. By forming p-channel transistors 124 on the (110) oriented silicon surfaces 112, maximum hole mobility and drive current can be obtained as compared to other crystal orientations. Therefore, the embodiment shown in FIG. 2a will achieve maximum mobilities and drive currents in p-channel and n-channel transistors based on optimal crystal orientations. While one goal of certain embodiments of the present invention is to optimize the performances of the n-channel and p-channel transistors, it is understood, for example, that not all p-channel transistors in the silicon-on-insulator chip need to be formed on the (110) oriented silicon surfaces, and that not all n-channel transistors in the silicon-on-insulator chip need to be formed on the (100) oriented silicon surfaces.

In another preferred embodiment, as shown in FIG. 2b, silicon islands 110 and 112 with (100) and (023) oriented surfaces are formed on the insulator layer, where n-channel transistors 122 are formed on (100) oriented silicon surfaces 110 and p-channel transistors 124 are formed on (023) oriented silicon surfaces 112. While not illustrated, yet other orientations can be included.

Figure 2C:
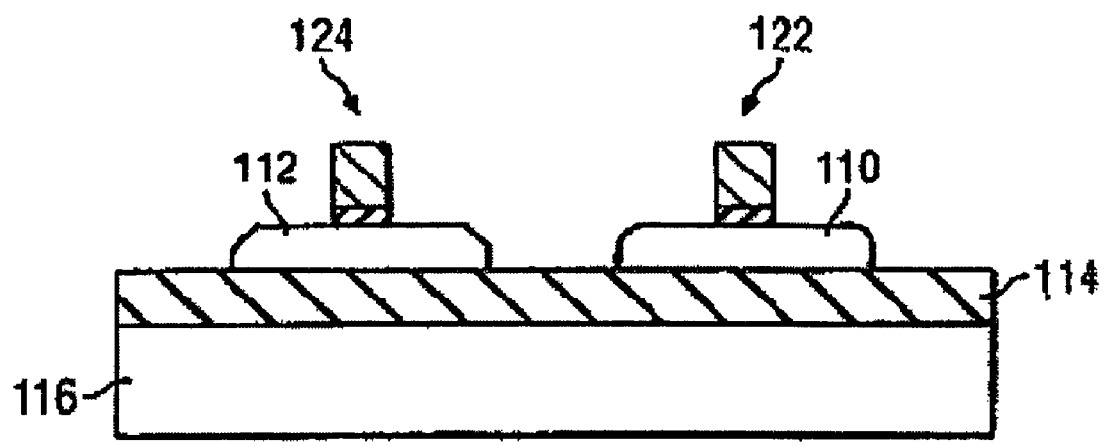
FIG. 2c is another specific example showing silicon islands with corners that are rounded or faceted.

In general, the silicon islands 110 and 112 may not be of the same thickness. This is shown in the figure where the thickness of the silicon islands 110 with (100) oriented surface may be $t_{Si1}$, and the thickness of the silicon islands 112 with (023) oriented surface may be $t_{Si2}$. It is possible that these thicknesses $t_{Si1}$ and $t_{Si2}$ are the same. In addition, silicon islands of the same surface crystal orientations need not have the same thickness. The silicon islands 110 and 112 preferably have a thickness in the range of about 10 angstroms to about 1000 angstroms. It is also understood that the cross-sectional views of the silicon islands 110 and 112 are only for the purpose of illustration. For example, the silicon islands 110 and/or 112 need not have sharp corners. The corners of the silicon islands 110 and/or 112 may be rounded or faceted as shown in FIG. 2c.

In one example, a silicon island 110 and/or 112 with a surface of a predetermined crystal orientation may be formed from a stack of two or more layers of silicon, where the topmost silicon layer has a surface of the predetermined crystal orientation. Such a stack may have a total or combined thickness in the range of about 10 angstroms to about 1000 angstroms. This embodiment is more clearly illustrated in FIG. 3.

Figure 3:
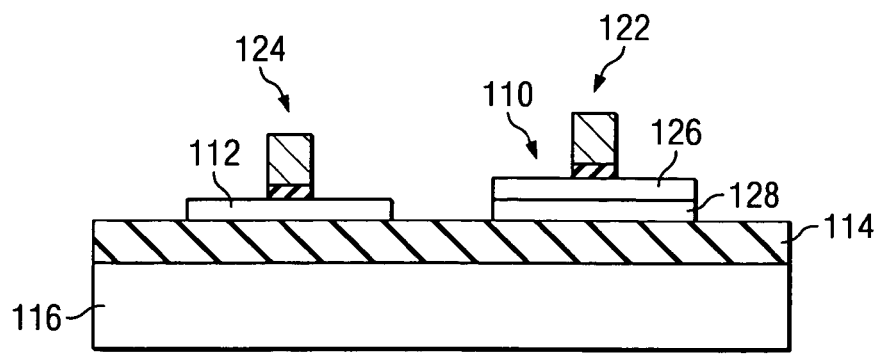
FIG. 3 is a specific example showing that at least one of the silicon islands may be comprised of a stack of silicon layers.

In the example illustrated in FIG. 3, the silicon island 110 includes two layers of silicon, the topmost layer 126 having a (h k l) crystal orientation, e.g., (100) oriented silicon surface, and the bottom layer 128 having a (h' k' l') crystal orientation where (h' k' l') may be (110), as an example. It is known that the charge carriers in the transistor inversion layer have a thickness of less than 50 angstroms. Therefore, in the example of FIG. 3, as long as the electrons in the inversion layer of the n-channel transistors 122 are entirely (or mostly) contained in the topmost (100) oriented silicon layer, it will have the maximum mobility or transport properties as desired.

In general, the insulator layer 114 as shown in FIGS. 1-3 may be comprised of any dielectric material or insulating material such as silicon oxide, silicon nitride, and aluminum oxide (also known as sapphire). The thickness of the insulator may range from about 100 angstroms to about 2000 angstroms. The insulator layer may also be a composite layer comprising of a stack combination of dielectric materials, such as an aluminum oxide on a silicon oxide stack, or a silicon nitride on a silicon oxide stack. The insulator layer may be in an amorphous state, poly-crystalline state, or in a crystalline state.

The insulator layer 114 overlies a substrate 116. The substrate 116 may be any substrate commonly used in semiconductor processing, such as a silicon substrate with (100) orientation or (110) orientation or any other orientation. The substrate 116 may also be comprised of an alloy semiconductor such as silicon-germanium or any compound semiconductor such as gallium arsenide and indium phosphide. Non-semiconductor substrates such as quartz or glass could alternatively be used.

Next, the present invention provides several methods of forming the silicon-on-insulator chip with multiple surface crystal orientations. Several of these embodiments will be described now.

Figure 4A:
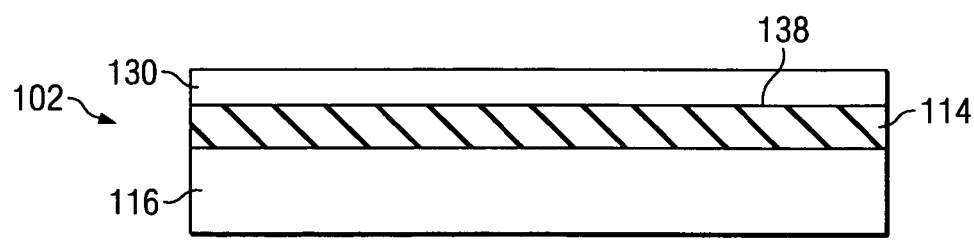
FIGS. 4a-4e show a first embodiment method of forming regions with different silicon crystal orientations.

The first embodiment method will now be described with respect to FIGS. 4a-4e. As shown in FIG. 4a, a silicon-on-insulator wafer 102 is provided where the crystalline silicon layer 130 has a first crystal orientation (h k l). Therefore, the surface of the silicon layer is of the (h k l) crystal orientation. Such a silicon-on-insulator 102 wafer may be formed by a wafer bonding and wafer separation technique, or by an oxygen implantation (SIMOX) technique, as examples.

Figure 4B:
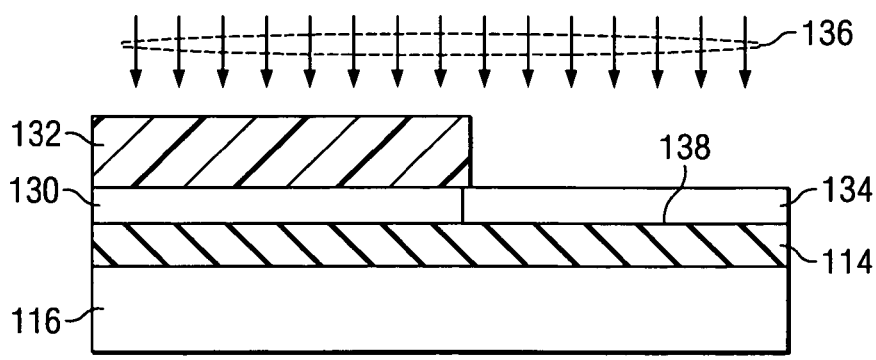

Selected portions 134 of the silicon layer 130 are amorphosized, i.e., transformed to the amorphous state. This transformation can be performed by masking the wafer 102, opening the mask 132 at the selected portions 134 of the silicon layer 130 to be amorphosized, and implanting ions 136 into the selected portions 134 of the silicon layer 130 to create an amorphous region as shown in FIG. 4b. The ion implantation can be done by conventional ion implantation techniques such as beam-line ion implantation or plasma immersion ion implantation (PIII). Preferably, the implanted ions are silicon ions and implanted to a depth close to the half the thickness of the silicon layer 130. However, other ions such as germanium ions and argon ions may be used.

Figure 4C:
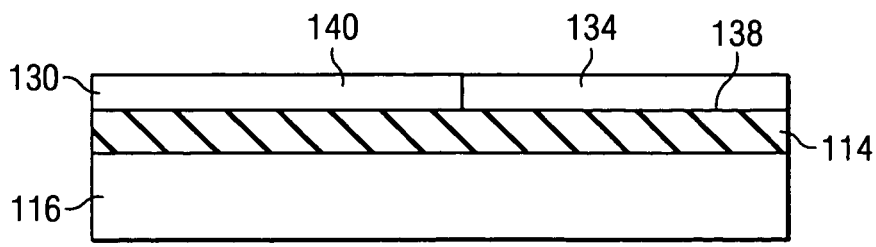

The wafer 102 is then heated at elevated temperatures, such as between about 500 to about 600 degrees Celsius, to initiate solid phase epitaxy. Solid phase epitaxy is essentially a re-crystallization process where the amorphous silicon region is transformed into a crystalline region. The amorphous silicon portion 134 re-crystallizes using the underlying crystalline insulator surface 138 as a seed as shown in FIG. 4c. The insulator 114 can serve as a seed if the insulator 114 is crystalline or if the insulator 114 has a surface 138 that is crystalline. For example, the insulator layer 114 may be crystalline aluminum oxide, i.e., sapphire. In another example, the insulator layer 114 is in fact a stack comprising of a sapphire layer on a silicon oxide layer.

After the re-crystallization of the amorphous portion 134 of silicon layer 130, a silicon layer portion 134 with a (h' k' l') crystal orientation is formed. The (h' k' l') crystal orientation is different from the original (h k l) crystal orientation of the silicon layer 130. In the preferred embodiment, (h k l) is (110), (h' k' l') is (100), and the insulator layer 114 is (0,1,−1,2) oriented sapphire.

The preferred embodiment is now described in further detail. This embodiment begins with a (110) oriented silicon layer 130 on a (0,1,−1,2) oriented sapphire layer 114, where the sapphire layer 114 overlies a substrate 116. Such a wafer may be formed by a wafer bonding and wafer separation technique. Selected regions 134 of the (110) oriented silicon layer 130 are amorphosized by a masked implantation of silicon ions. Re-crystallization of the amorphosized silicon 134 using (0,1,−1,2) oriented sapphire as a seed yields (100) oriented silicon in the selected regions. The silicon layer 130 now comprises of regions 134 and 140 with different crystal orientation.

Figure 4D:
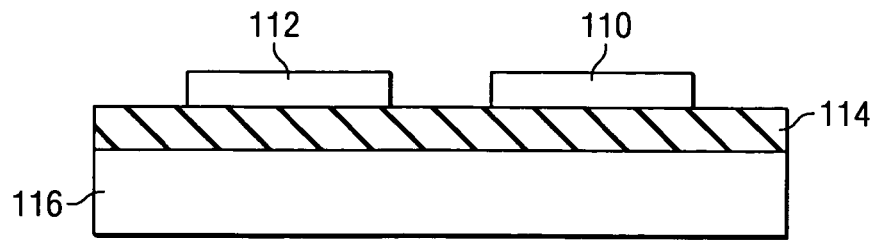
Figure 4E:
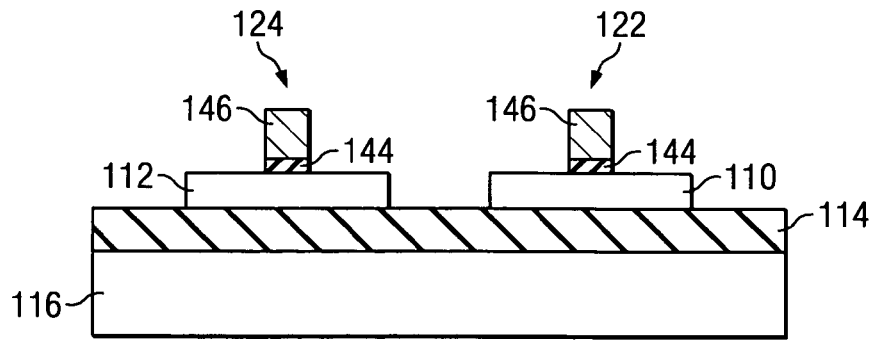

Silicon islands 110 and 112 with different crystal orientations may be formed by selective masking and etching as shown in FIG. 4d. Transistors 122 and 124 may then be formed on these islands as shown in FIG. 4e. The transistors 122 and 124 can be formed by depositing a gate dielectric layer and gate conductor layer(s), and then patterning these to form a gate dielectric 144 and gate 146. Source and drain regions (not explicitly shown) can then be formed using standard implantation steps. While not shown, the gate 146 may include a gate spacer to form lightly doped source and/or drain portions.

Figure 5A:
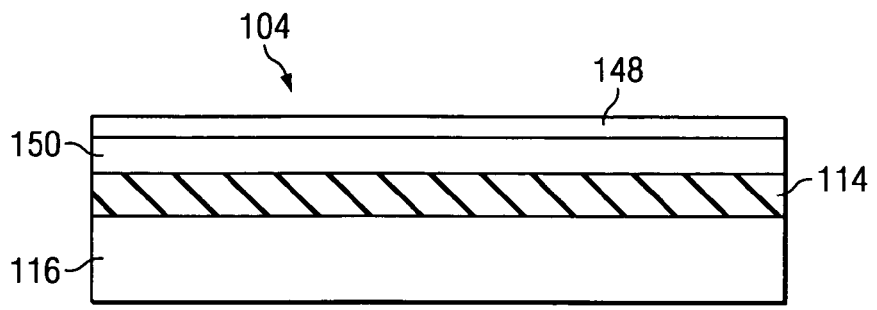
FIGS. 5a-5f show a second embodiment method of forming regions with different silicon crystal orientations.

FIGS. 5a-5f show a second embodiment method of the present invention. A silicon-on-insulator wafer 104 is provided as shown in FIG. 5a. The silicon layer in FIG. 5a includes at least two layers 148 and 150 of silicon with different crystal orientations. As shown in FIG. 5, a topmost silicon layer 148 with the (h k l) crystal orientation overlies a silicon layer 150 with the (h' k' l') crystal orientation. The thickness of the topmost silicon layer 148 may vary from about 10 angstroms to about 500 angstroms, but is preferably less than about 50 angstroms. The thickness of the silicon layer 150 may be in the range of about 10 to about 500 angstrom and is once again less than about 50 angstroms.

In one example, the topmost silicon layer 148 can be formed by a layer transfer technique, which comprises of a wafer bonding process and a wafer separation process. For example, we may begin with a silicon-on-insulator target wafer, which comprises of a (100)-oriented silicon layer overlying an insulator layer. A donor wafer with a (110)-oriented silicon surface layer may be provided. The donor wafer may, for example, be a (110)-oriented bulk silicon substrate. It is desired to transfer a top portion of donor wafer to the target wafer. This transfer can be accomplished by implanting hydrogen into the donor wafer, bonding the top surface of the donor wafer to the top surface of the target wafer, and performing an anneal to separate a portion of the donor wafer. The top portion of the donor wafer, i.e., a (110)-oriented silicon layer, then adheres to the target wafer. A bond-strengthening anneal may subsequently be performed.

Similar processes for wafer bonding and separation are taught in co-pending application Ser. No. 10/379,873 (TSMC2002-1384) and Ser. No. 10/384,859 (TSMC2002-1385), both of which are incorporated herein by reference. As examples, the wafer bonding and separation process can be a Smartcut™ process, or a Nanocleave™ process, both available from Silicon Genesis Corporation. Details of bonding and separation processes are also provided in U.S. Pat. Nos. 5,013,681, 5,374,564, 5,863,830, 6,355,541, 6,368,938, and 6,486,008, each of which is incorporated herein by reference.

Figure 5B:
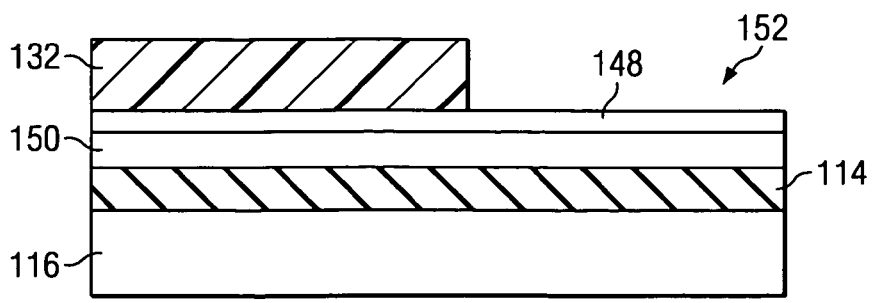
Figure 5C:
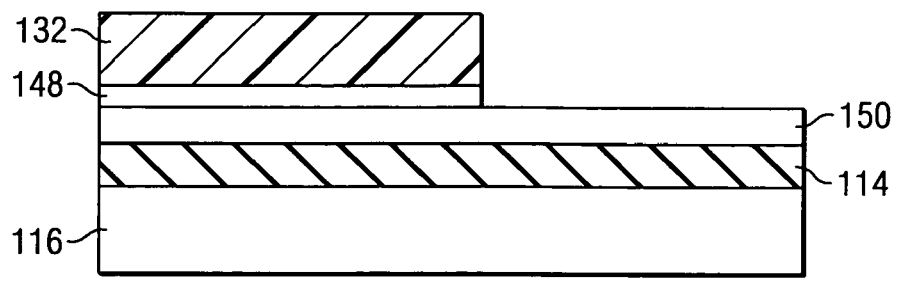

A patterned mask 132 is formed to expose a selected portion 152 of the topmost (h k l) silicon layer 148 as shown in FIG. 5b. The exposed portion 152 topmost (h k l) oriented silicon layer 148 is then etched as shown in FIG. 5c. For example, the etch can be a wet etch that is selective with respect to silicon crystal orientations. As a more specific example, etchants such as potassium hydroxide and caesium hydroxide may be used to etch (110) oriented silicon at a much faster rate compared to (100) oriented silicon. Potassium hydroxide etches (110) oriented silicon at twice the rate of (100) oriented silicon.

Figure 5D:
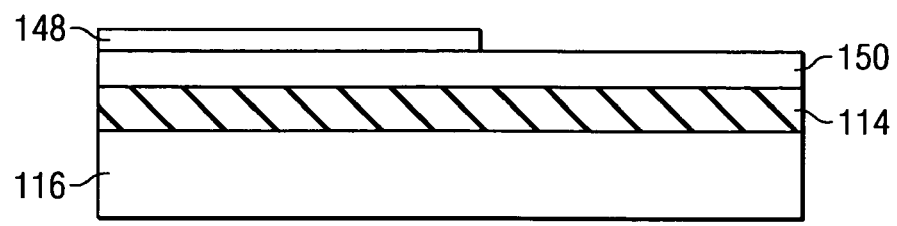
Figure 5E:
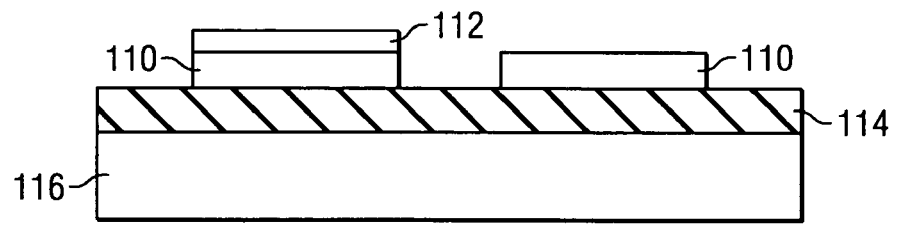
Figure 5F:
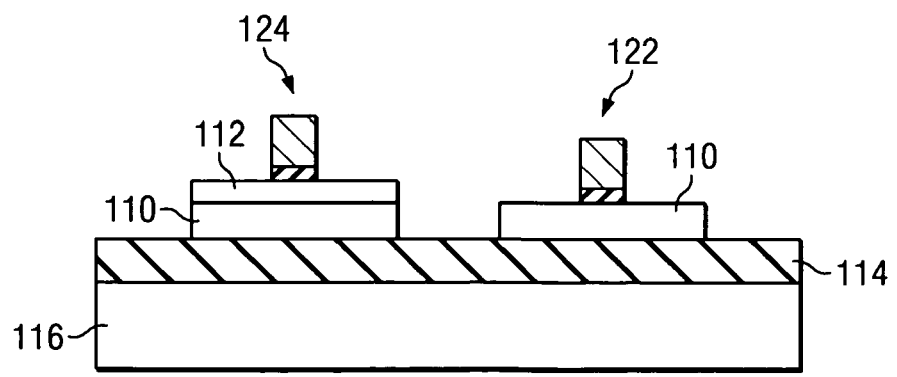

Following the etching of the topmost (h k l) oriented silicon layer, the mask 132 is then removed as shown in FIG. 5d. According to the second embodiment method, it is preferred that topmost (h k l) oriented silicon is (110) oriented silicon, and the (h' k' l') oriented silicon is (100) oriented silicon. Another mask (not shown) may be formed to pattern silicon islands 110 and 112, as shown in FIG. 5e. N-channel and p-channel transistors 122 and 124 may then be formed on the patterned silicon islands 110 and 112, as shown in FIG. 5f.

Figure 6A:
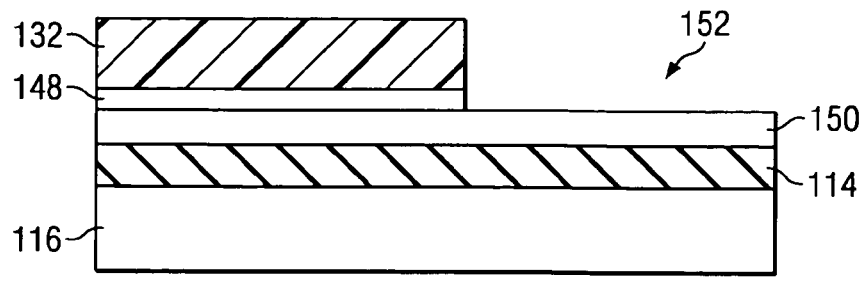
FIGS. 6a-6c show a third embodiment method of forming regions with different silicon crystal orientations.
Figure 6B:
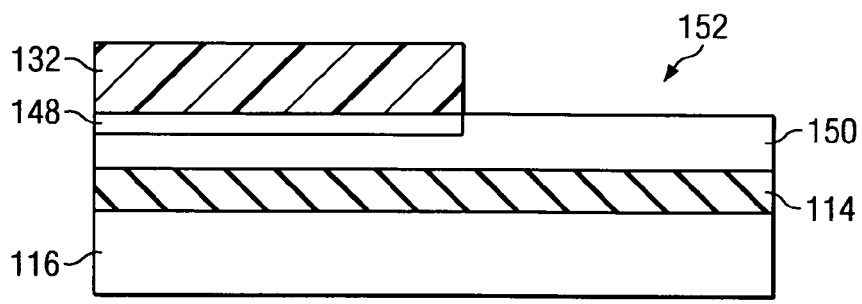
Figure 6C:
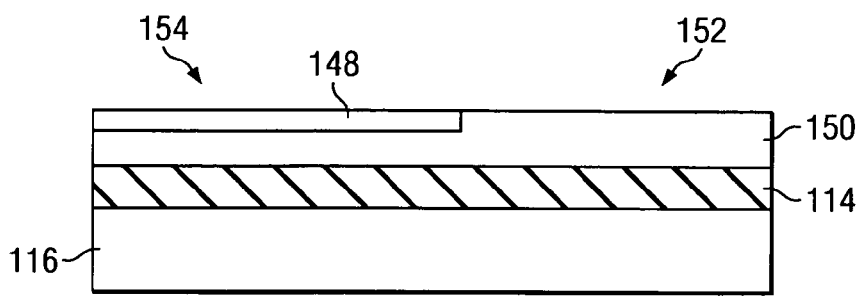

Referring now to FIG. 6a-6c, a third embodiment method will now be described. The initial steps of the third embodiment method are similar to those of the second method embodiment. The third embodiment method employs a silicon-on-insulator substrate 104 where the silicon layer comprises at least two layers of silicon 148 and 150 with different crystal orientations. Continuing from FIG. 5c, the topmost (h k l) oriented silicon layer 148 has been selectively etched in a predetermined region 152, exposing the underlying (h' k' l') oriented silicon layer 150, as shown in FIG. 6a.

Subsequently, a selective epitaxial growth is performed. This can be a chemical vapor deposition process where silane and hydrogen chloride gases are used and the process temperature may range from about 500 degrees Celsius to about 900 degrees Celsius. The epitaxial growth occurs selectively in the exposed (h' k' l') oriented surface. The cross-section of the substrate is shown in FIG. 6b.

Referring now to FIG. 6c, the mask can then be removed. As can be seen, a first region 152 comprises of silicon with a (h k l) orientation and a second region 152 comprises of silicon with a (h' k' l') orientation. Silicon islands 110 and 112 may then be patterned and transistors 122 and 124 be formed on the islands (not shown with FIG. 6; see FIGS. 4d-4e or FIGS. 5e-5f).

Figure 7A:
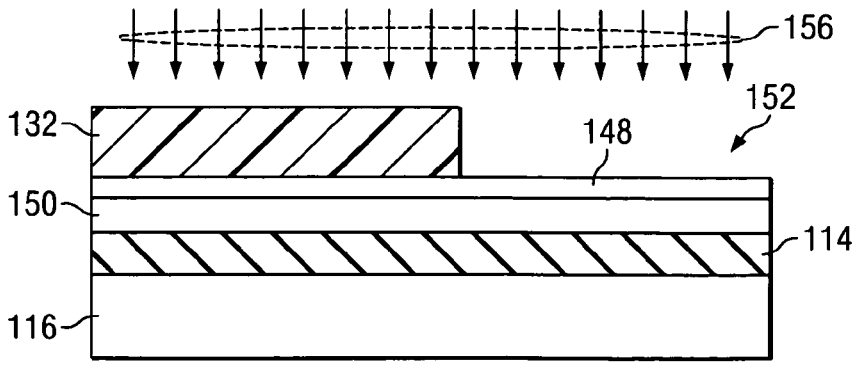
FIGS. 7a-7c show a fourth embodiment method of forming regions with different silicon crystal orientations.
Figure 7B:
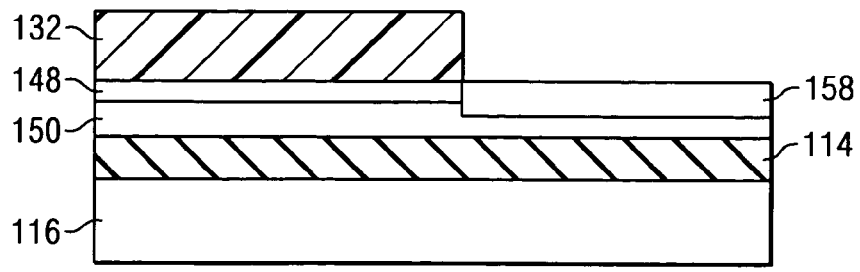
Figure 7C:
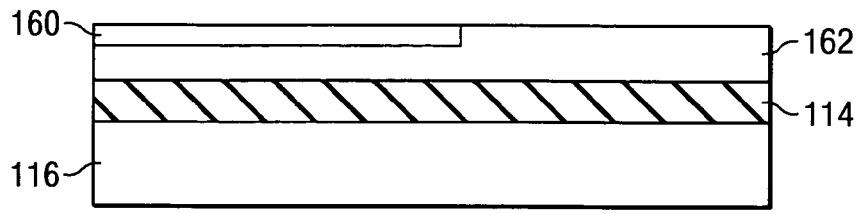

Referring now to FIGS. 7a-7c, a fourth embodiment method will now be described. Once again, the initial steps of the fourth embodiment method are similar to those of the second embodiment method. Continuing from FIG. 5b, the topmost (h k l) oriented silicon layer 148 has been selectively exposed in a predetermined region 152. Ion implantation 156 is then performed to transform the exposed (h k l) oriented silicon into an amorphous phase, as shown in FIG. 7a. The ion implantation may employ silicon, germanium or argon ions. The implantation energy is chosen such that the amorphosized region is restricted to the surface region where the silicon crystal orientation is (h k l). The crystallinity of the underlying (h' k' l') oriented silicon layer 150 in the exposed region 152 is retained so that it will serve as a seed layer for re-crystallization of the amorphous region 158. This is shown in FIG. 7b. The mask 132 is then removed.

Next, the wafer is heated at elevated temperatures, such as between about 500 to about 600 degrees Celsius, to initiate solid phase epitaxy. Re-crystallization of the amorphosized silicon occurs using the underlying (h' k' l') oriented silicon 150 as a seed layer. Silicon islands 110 and 112 with different crystal orientations may be formed by selective masking and etching and transistors 122 and 124 may then be formed on these islands as discussed above.

Figure 8A:
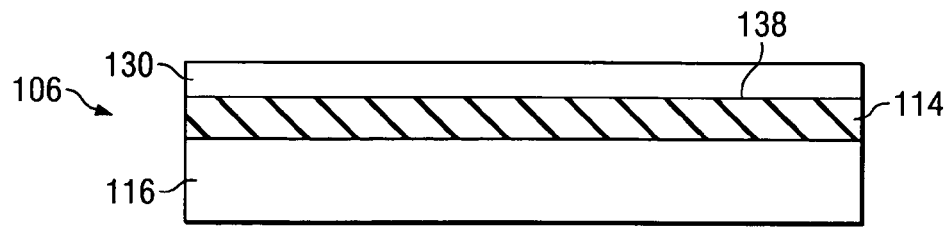
FIGS. 8a-8c show a fifth embodiment method of forming regions with different silicon crystal orientations.
Figure 8B:
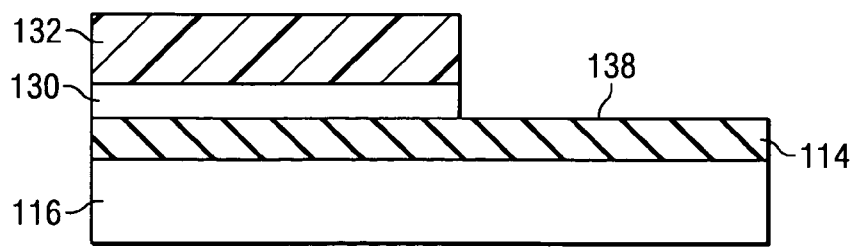
Figure 8C:
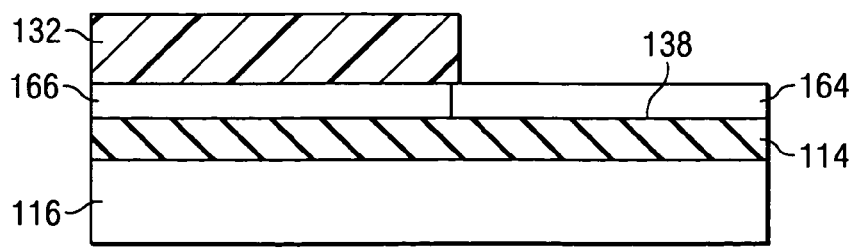

Referring now to FIG. 8a-8c, a fifth embodiment method is discussed. A silicon-on-insulator wafer 106 is provided where the crystalline silicon layer has a first crystal orientation (h k l), as shown in FIG. 8a. Referring to FIG. 8b, selected portions of the silicon layer 130 are etched to expose the crystalline surface 138 insulator 114. This can be done by masking the wafer with a mask 132, opening the mask 132 at the selected portions of the silicon layer 130 to be etched, and etching the selected portions of the silicon layer 130 by dry or wet etching.

Epitaxy is then performed to grown a silicon layer 164 with a (h' k' l') crystal orientation on the exposed crystalline insulator surface. The epitaxy step can be performed before the mask 132 is removed, as shown in FIG. 8c, or after the mask 132 is removed. This step will result in a first region 166 with a (h k l) crystal orientation and a second silicon region 164 with a (h' k' l') crystal orientation. Silicon islands 110, 112 with different crystal orientations may be formed by selective masking and etching and transistors 122 and 124, can then be formed on these islands.

Figure 9A:
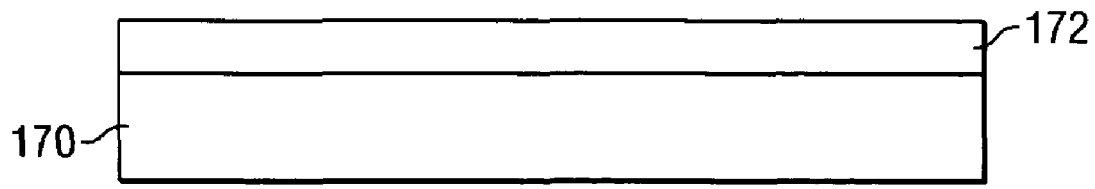
FIGS. 9a-9c provide illustrations where concepts of the present invention are applied to a bulk semiconductor substrate.

Each of the embodiments described to here were directed to a silicon-on-insulator substrate. The present invention, however, also includes embodiments applicable to bulk substrate devices. Referring to FIG. 9a, as an example, the starting substrate includes a silicon substrate 170 that has a (h' k' l') crystal orientation. No insulator layer is included. A silicon layer 172, which has a (h k l) crystal orientation, is formed over substrate 170.

Figure 9B:
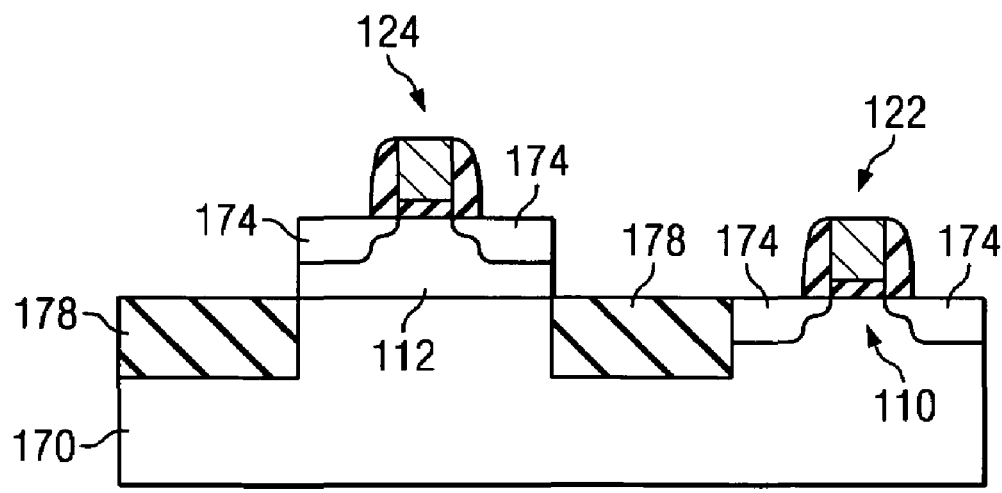
Figure 9C:
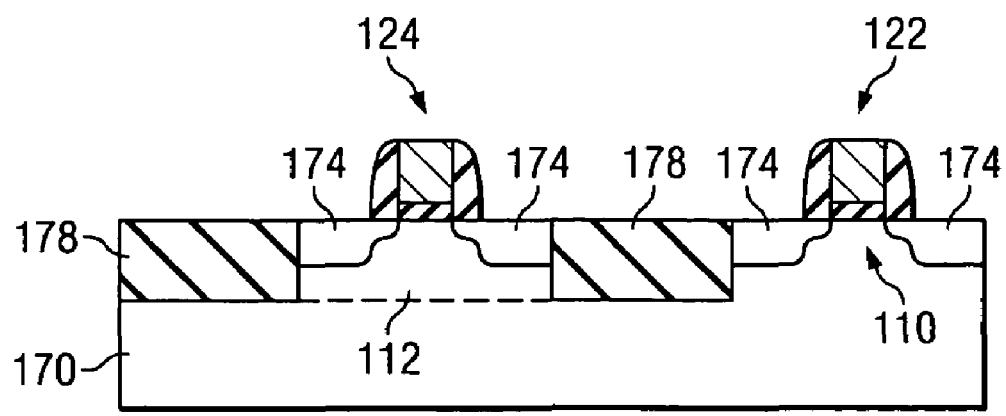

This substrate can then be processed to formed semiconductor regions of different crystal orientations as shown in FIGS. 9b and 9c. For example, any of the embodiments shown in FIG. 5, 6 or 7 can be used to form regions 174 and

176 of different crystal orientations. FIG. 9*b* shows an embodiment made by a process similar to that of FIG. 5, and FIG. 9*c* shows an embodiment made by a process similar to that of FIG. 6. The different crystal orientation regions 174 and 176 can be separated by any isolation technique. Shallow trench isolation 178 is shown. As described above, and as shown in the embodiments of FIGS. 9*b* and 9*c*, p-channel transistors 124 can be formed in the regions 112 with (h k l) crystal orientation and n-channel transistors 122 can be formed in the regions 110 with (h' k' l') crystal orientation.

Although particular embodiments of the invention have been described in detail, it is understood that the invention is not limited correspondingly in scope, but includes all changes, modifications, and equivalents coming within the spirit and terms of the claims appended hereto. Accordingly, the specification and figures are to be regarded in an illustrative rather than a restrictive sense.

What is claimed is:

1. A method of forming a semiconductor chip, the method comprising:
    masking a first region of a first silicon layer, the first silicon layer having a first crystal orientation, and the first silicon layer having a thickness of less than 50 angstroms;
    while the first region is masked, etching through the first silicon layer at a second region to expose an immediately underlying layer located under the first silicon layer; and
    performing epitaxial growth of silicon with a second crystal orientation on the immediately underlying layer at the second region to form a second silicon layer having a thickness of less than 50 angstroms, and wherein the second crystal orientation is different from the first crystal orientation.

2. The method of claim 1, wherein the underlying layer comprises silicon with the second crystal orientation.

3. The method of claim 1, wherein the first crystal orientation is selected from the group consisting of (100), (110), (023), (111), (311), and (511).

4. The method of claim 1, wherein the second crystal orientation is selected from the group consisting of (100), (110), (023), (111), (311), and (511).

5. The method of claim 1, wherein the method further comprises forming the first silicon layer using a wafer bonding technique, wherein the first crystal orientation is (110).

6. The method of claim 5, wherein the underlying layer comprises silicon with the second crystal orientation and wherein the second crystal orientation is (100).

7. The method of claim 1, wherein the underlying layer is a dielectric layer.

8. The method of claim 1, wherein the first silicon layer is formed over a dielectric layer.

9. The method of claim 1, wherein the method further comprises:
    forming a first silicon island at the first region;
    forming a second silicon island at the second region;
    forming a first transistor of a first conductive type on the first silicon island; and
    forming a second transistor of a second conductive type on the second silicon island.

10. A method of forming a semiconductor chip, the method comprising:
    forming a plurality of silicon layers overlying one another using a wafer bonding technique,
    wherein the plurality of silicon layers includes a first silicon layer located immediately over a second silicon layer,
    wherein the first silicon layer has a first crystal orientation of (110),
    wherein the second silicon layer has a second crystal orientation, the second crystal orientation being different from the first crystal orientation,
    wherein the first silicon layer includes a first region and a second region;
    etching through the first silicon layer at the second region to expose the second silicon layer; and
    performing epitaxial growth of silicon of the second crystal orientation on the second silicon layer at the second region.

11. The method of claim 10, wherein the second crystal orientation is selected from the group consisting of (100), (023), (111), (311), and (511).

12. The method of claim 10, wherein the method further comprises:
    forming a first silicon island at the first region;
    forming a second silicon island at the second region;
    forming a first transistor of a first conductive type on the first silicon island; and
    forming a second transistor of a second conductive type on the second silicon island.

13. A method of forming a semiconductor chip, the method comprising:
    masking a first region of a first silicon layer, the first silicon layer being formed on a dielectric layer as part of a silicon-on-insulator (SOI) substrate, and the first silicon layer having a first crystal orientation;
    while the first region is masked, etching through the first silicon layer at a second region to expose the dielectric layer at the second region;
    performing epitaxial growth of silicon with a second crystal orientation on the dielectric layer at the second region, such that the second crystal orientation is different from the first crystal orientation;
    forming a first silicon island at the first region;
    forming a second silicon island at the second region;
    forming a first transistor of a first conductive type on the first silicon island; and
    forming a second transistor of a second conductive type on the second silicon island.

14. The method of claim 13, wherein the first silicon layer has a thickness of less than 50 angstroms.

15. The method of claim 13, wherein the silicon with the second crystal orientation grown on the dielectric layer has a thickness of less than 50 angstroms.

16. A method of forming a semiconductor chip, the method comprising:
    forming a first silicon layer using a wafer bonding technique, wherein a first crystal orientation is (110);
    masking a first region of the first silicon layer, the first silicon layer being formed on a dielectric layer as part of a silicon-on-insulator (SOI) substrate, and the first silicon layer having the first crystal orientation;
    while the first region is masked, etching through the first silicon layer at a second region to expose the dielectric layer at the second region; and
    performing epitaxial growth of silicon with a second crystal orientation on the dielectric layer at the second region, such that the second crystal orientation is different from the first crystal orientation.

17. The method of claim 13, wherein the first crystal orientation is selected from the group consisting of (100), (110), (023), (111), (311), and (511).

18. The method of claim 13, wherein the second crystal orientation is selected from the group consisting of (100), (110), (023), (111), (311), and (511).

19. A method of forming a semiconductor chip, the method comprising:
   masking a first region of a first silicon layer, the first silicon layer being formed on a dielectric layer as part of a silicon-on-insulator (SOI) substrate, and the first silicon layer having a first crystal orientation, wherein the dielectric layer comprises aluminum oxide with a dielectric crystal orientation of (0,1,1,2);
   while the first region is masked, etching through the first silicon layer at a second region to expose the dielectric layer at the second region; and
   performing epitaxial growth of silicon with a second crystal orientation on the dielectric layer at the second region, such that the second crystal orientation is different from the first crystal orientation.

20. The method of claim 13, wherein the first silicon layer has a thickness in a range from about 10 angstroms to about 500 angstroms.

\* \* \* \* \*